United States Patent [19]
Hashizume et al.

[11] Patent Number: 6,029,260
[45] Date of Patent: Feb. 22, 2000

[54] MEMORY ANALYZING APPARATUS

[75] Inventors: Ken Hashizume, Ota-ku; Norifumi Kobayashi, Yokohama; Hideaki Kuroda, Sagamihara, all of Japan

[73] Assignees: Kabushiki Kaisha Toshiba, Kawasaki; Asia Electronics Inc., Tokyo-to, both of Japan

[21] Appl. No.: 08/919,149

[22] Filed: Aug. 28, 1997

[30]   Foreign Application Priority Data

Aug. 30, 1996   [JP]   Japan ................................. 8-230984

[51] Int. Cl.[7] ................................................ G11C 29/00
[52] U.S. Cl. ............................................. 714/723; 714/718
[58] Field of Search ..................................... 714/723, 718

[56]   References Cited

U.S. PATENT DOCUMENTS 5,400,342   3/1995   Matsumura et al. ..................... 714/719

*Primary Examiner*—Phung M. Chung

*Attorney, Agent, or Firm*—Foley & Lardner

[57]   ABSTRACT

When defective bits of a memory are remedied, the disclosed memory analyzing apparatus can execute remedy analysis of a large capacity memory freely and effectively in a short time. Data are transferred from a defect cell memory (3) provided for a memory tester body (1) to a remedy analyzing apparatus (2) in the sequence suitable for defect remedy. The transferred data are regenerated in address sequence, and the numbers of the defective bits are counted and stored in an X line defect memory (26) and a Y line defect memory (27) at the same time. Further, a line detect flag is raised on the basis of the number of detective bits in the same row and the same column. Further, with respect to the defective bits of a line other than the defect line, the addresses thereof are stored in the bit defect memory (35), and the number of the defect bits is stored in a unit region defect number memory (33) for each defect remedy unit region. A CPU (5) allocates remedy lines to the line defects with a priority, and further processes the allocation analysis of the remedy lines on the basis of the data obtained from the respective memories (26, 27, 33, and 35), so that it is possible to reduce the remedy processing time markedly.

21 Claims, 15 Drawing Sheets

| DEFECTIVE BIT | X ADDRESS | Y ADDRESS | REMEDY LINE ALLOCATION R1~R2 | REMEDY LINE ALLOCATION C1~C3 |
|---|---|---|---|---|
| F1 | 0 | 0 | R1 | |
| F2 | 1 | 0 | R1 | |
| F3 | 2 | 0 | R1 | |
| F4 | 3 | 0 | R1 | |
| F5 | 4 | 0 | R1 | |
| F6 | 0 | 1 | R2 | |
| F7 | 2 | 3 | | C1 |
| F8 | 3 | 3 | | C2 |
| F91 | 6 | 5 | | C3 |

FIG. 8

| DEFECTIVE BIT | X ADDRESS | Y ADDRESS | REMEDY LINE ALLOCATION ||
|---|---|---|---|---|
| | | | R1~R3 | C1~C3 |
| F6 | 0 | 1 | R2 | |
| F7 | 2 | 3 | R3 | |
| F8 | 3 | 3 | R3 | |
| F9 | 6 | 5 | | C2 |
| F10 | 8 | 3 | | C3 |
| F11 | 6 | 4 | | |

FIG. 10

MEMORY ANALYZING APPARATUS

BACKGROUND OF THE INVENTION

1. Field of the Invention

The present invention relates to a memory analyzing apparatus, and more specifically to a structure of an apparatus for analyzing memory defects and for effectively remedying defective memory cells at high speed.

2. Description of the Prior Art

With increasing capacity of the memory device, a possibility of the memory device including defective memory cells increases, so that it has become difficult to maintain a high yield of the memory device. To overcome this problem; that is, to improve the yield of the memory device, it has become usual to remedy memory device by replacing a defective memory cell with another normal memory cell.

The usual memory device, for instance, DRAM or SRAM comprises, as shown in FIG. 12, an X address decoder 11 for decoding X addresses (column addresses) arranged in the X direction (row direction) and a Y address decoder 12 for decoding Y addresses (row addresses) arranged in the Y direction (column direction). Therefore, data can be written or read in or from the memory device by selecting some of the memory cells (or memory elements) 15 arranged in a matrix pattern.

Further, in order to remedy defective cells, a line having a defective cell is replaced with one of remedy lines (spare lines) for each appropriate defect remedy unit region 10. The spare lines are composed of column spare lines 16 and row spare lines 17, and these spare lines are arranged in each of the X and Y directions. Further, each spare line can be selected by an X spare (column spare) decoder 13 and a Y spare (row spare) decoder 14, respectively.

In the construction as described above, when a defective cell exists in a column line of the memory cell 15, this column line is replaced with a column spare line 16; and when a defective cell exists in a row line of the memory cell 15, this low line is replaced with a row spare line 17, both as shown by two arrows A and B in FIG. 12.

Here, when the defective cells of the memory cells 15 are replaced with the remedy lines 16 and 17, the line replacement is usually designated by cutting off a fuse.

Here, the method of remedying the defective cells of the memory device differs according to the distribution of the defective cells. Therefore, it is known that the remedy methods and systems have been so far discussed in various ways. Here, however, the procedure of how to remedy the defective cells of the memory cells 15 has become complicated more and more with increasing capacity of the memory device, so that it is usual to use a remedy analysis apparatus, in addition to a memory test body.

FIG. 13 is a block diagram showing a prior art memory analyzing apparatus for realizing the memory remedy function. As shown in FIG. 13, a defect cell memory 3 is provided in a memory tester body 1. In this defect cell memory 3, a defective cell status of a memory cell to be tested is stored. On the other hand, a remedy analyzing apparatus 2 is provided with a memory 4 connected to the defect cell memory 3. Further, the defect cell memory 3 of the memory tester body 1 and the memory 4 of the remedy analyzing apparatus 2 are so constructed as to be accessed at the same time by use of an address counter 6. Data of the defect cell memory 3 are written in the memory 4, and the written data are analyzed by a plurality of CPUs 5.

The operation of the above-mentioned prior art memory analyzing apparatus will be explained hereinbelow. First, the data of the defect cell memory 3 are read in sequence by activating an address counter 6, and the read data are written in the memory 4 of the remedy analyzing apparatus 2.

Further, the defect data of the memory cells are obtained by checking whether the contents of the memory 4 are normal or abnormal by use of the plural CPUs 5. Further, a memory remedy solution can be obtained on the basis of the obtained defect data.

Here, the case as shown in FIG. 14 will be considered by way of example, in which a defect remedy unit region 10 of one memory is shown. In FIG. 14, when defective cells are seen in the row line direction, there are four defective cells (shown by x) as A1, A2; A3; A4; and A5. Further, when seen in column line direction, there are three defective cells (shown by x) as A1, A3; A5; A2; and A4;

In this case, the cells are not simply remedied, but the remedy lines are decided by checking the distribution of the defective cells A1, A2, A3, A4 and A5.

For instance, although the column addresses of the two defective cells A1 and A2 are different from each other, since the row address of these two defective cells A1 and A2 is the same, these two defective cells A1 and A2 can be remedied by use of only one common remedy line (the row address is R1) of the row spare lines 17.

On the other hand, although the column address of the defective cell A4 is the same as that of the defective cell A2, in this case, these two defective cells A4 and A2 are remedied by use of another remedy line (the row address is R2) of the row spare lines 17.

Further, although the column address of the defective cell A3 is the same as that of the defective cell A1, the defective cell A1 has been already remedied by the other spare remedy line (the row address is R1) of the row spare lines 17. Further, in this case, the defective cell A3 is remedied by a spare remedy line (the column address is C1) of the column spare lines 16.

Further, the defective cell A5 is remedied by another spare remedy line (the column address is C2) of the column spare lines 16.

As a result of the above-mentioned remedy, however, there exists a case where a defective cell A6 is newly added by the spare remedy line (the designated row address is R1) of the row spare lines 17. In this case, however, since the column address C2 of this defective cell A6 is the same as the column address C2 of the defective cell A5, it is possible to remedy this defective cell A6 by the column direction remedy line (the column address is C2) of the column spare lines 16.

As a result, the six defective cells A1 to A6 can be remedied by use of the two column lines (the column addresses are C1 and C2) and the two row lines (the row addresses are R1 and R2), that is, by use of four remedy lines in total.

In this case, however, as the defective cell remedy method, many combinations of various sorts can be considered by use of the column spare lines and the row spare lines. In addition, when the other defective cells are newly added by the row and column spare remedy lines, the combinations of the column and row spare lines are further complicated.

In the prior art memory analyzing apparatus as described above, the construction for remedying defective cells is such that: defective cells are detected for each defect remedy unit region 10; the remedy lines designated by the row addresses and column addresses are determined in correspondence to the defective cells. Therefore, although there exists such an advantage that one memory remedy unit region can be processes as a single block at high processing speed by a CPU 5, since it has been necessary to provide the memory 4 having the same capacity scale as that of the defect cell memory 3, in the memory remedy analyzing apparatus, there exists a problem in that the cost of the memory analyzing apparatus increases.

In addition, in the case of the large-capacity memory device, it is difficult to collect data including the defective cells existing on the remedy (spare) line as a block. In other words, when defective data are collected at the CPU 5 and then arranged so as to be analyzed and remedied easily, the data transfer between the memory 4 and the CPU 5 inevitably increases. Further, since the data arrangement is not regular, there arises another problem in that the processing time becomes markedly long.

In the case of the example as shown in FIG. 15, for instance, when five defective cells A1 to A5 are represented by use of R (row) and C (column), there exists six combinations of C-C-R-R sequence, C-R-C-R sequence, C-R-R-C sequence, R-R-C-C sequence, R-C-R-C sequence, and R-C-C-R sequence. Therefore, all the defective cells A1 to A5 must be decided, for each column remedy (spare) line and for each row remedy (spare) line, as to whether these defective cells can be remedied or not or as to whether there exists an effective remedy method or not, on the basis of trial and error method, in the sequence of the above six combinations, so that a huge analysis processing time is needed. Here, since this processing time increases acceleratively with increasing number of the defective cells, when the memory capacity is large, the analyzing time exerts a serious influence upon the manufacturing productivity of the memory device.

Further, as shown in FIG. 16, for instance, in the defect cell memory 3, even if the defective cells are arranged regularly as a sequence of a main cell, a row spare cell, a main cell, a column spare cell, . . . in the address direction, when these cells are read by the CPU 5 in practice, since the main cell portions and the respective row and column remedy portions are not arranged regularly, a long analyzing time is required for the CPU 5.

Further, in order to shorten the processing time, as shown in FIG. 17, it may be possible to consider such a method of increasing the total productivity by providing two defect cell memories 3 in the memory tester body 1. In this case, when one defect cell memory 3 is being used by the memory tester body, the other defect cell memory 3 is used by the remedy analyzing apparatus 2. In this method, however, there arises another problem in that the cost of the memory analyzing apparatus increases with increasing capacity of the defect cell memory 3.

As described above, in the prior art memory analyzing apparatus, since the memory remedy method has been complicated more and more with increasing capacity of the memory device, an extremely long time has been required to analyze how to remedy the defective cells. Further, since this remedy analysis is executed simultaneously with the general memory test, it is essential to shorten this remedy analysis time in order to shorten the memory test time; that is, to improve the memory productivity.

SUMMARY OF THE INVENTION

With these problems in mind, therefore, it is the object of the present invention to provide a memory analyzing apparatus, which can analyze and remedy a large capacity memory freely at a high efficiency and in a short time.

To achieve the above-mentioned problem, the present invention provides a memory analyzing apparatus, comprising: a defect cell memory for storing data related to defective bits of a memory to be measured; an X line defect memory for counting the number of defective bits in X line direction for each X line on the basis of data related to the defective bits transferred from said defect cell memory, to label an X line including defective bits more than a previously determined number as a defective line; a Y line defect memory for counting the number of defective bits in Y line direction for each Y line on the basis of data related to the defective bits transferred from said defect cell memory, to label a Y line including defective bits more than a previously determined number as a defective line; a bit detect memory for storing addresses of the defective bits counted by said X line defect memory and said Y line defect memory, respectively; a defect number memory for storing the numbers of defective bits calculated on the basis of values counted by said X line defect memory and said Y line defect memory, respectively; and processing means for executing remedy processing of defective cells on the basis of data stored in said X line defect memory and said Y line defect memory, said bit defect memory, and said defect number memory, respectively.

Further, it is preferable that a memory region of said defect cell memory is divided into a plurality of defect remedy unit region memory sections in correspondence to each of defect remedy unit regions of the memory to be measured and that the apparatus further comprises memory control means for reading the data from said defect cell memory for each of the defect remedy unit region memory sections, to transfer the data read for each of the defect remedy unit region memory sections to said X line defect memory, said Y line defect memory, said bit defect memory and said defect number memory, respectively, said defect number memory being a unit region defect number memory for storing the number of defective bits for each of the defect remedy unit regions.

BRIEF DESCRIPTION OF THE DRAWINGS

FIG. 8 is an illustration for assistance in explaining a defective bit table formed by a CPU in correspondence to the defective bits shown in FIG. 3;

FIG. 10 is an illustration for assistance in explaining a defective bit table formed by the CPU in correspondence to the defective bits shown in FIG. 9;

DETAILED DESCRIPTION OF THE PREFERRED EMBODIMENTS

In the memory analyzing apparatus according to the present invention, data are transferred from a defect cell memory provided in a tester body to the remedy analyzing apparatus in a sequence suitable for defective cell-remedy in unit of defective cell remedy region. Further, the transmitted data are regenerated in the sequence of the data transferred to the remedy analyzing apparatus, that is, in the order of addresses. Further, when the data are being transferred from the defect cell memory 3 of the tester body, the numbers of the defective cells in the same row and the same column are counted separately and then stored in a memory. Further, in this case, rows and columns each having defective bits more than a predetermined value (i.e., line defects) are detected in unit of defect remedy processing. Further, when a line defect is detected, a flag is raised in the memory. Further, addresses data related to the defective bits (other than the line defect) are collected in unit of the defect analysis and then given to a memory provided in the remedy analyzing apparatus.

As a result, on the CPU side, since the remedy lines can be allocated to the line defects unconditionally, the remedy analysis other than the line defects can be executed on the basis of the data other than those of the line defects, with the result that it is possible to reduce the number of combinations required for remedy analysis markedly and thereby the processing time of the CPU can be shortened. In addition, since the CPU can allocate any given numbers of the row or column remedy (spare) lines to the defective rows and/or the defective columns simultaneously, it is possible to reduce the remedy processing time markedly.

An embodiment of the present invention will be described in further detail hereinbelow with reference to the attached drawings.

Figure 1:
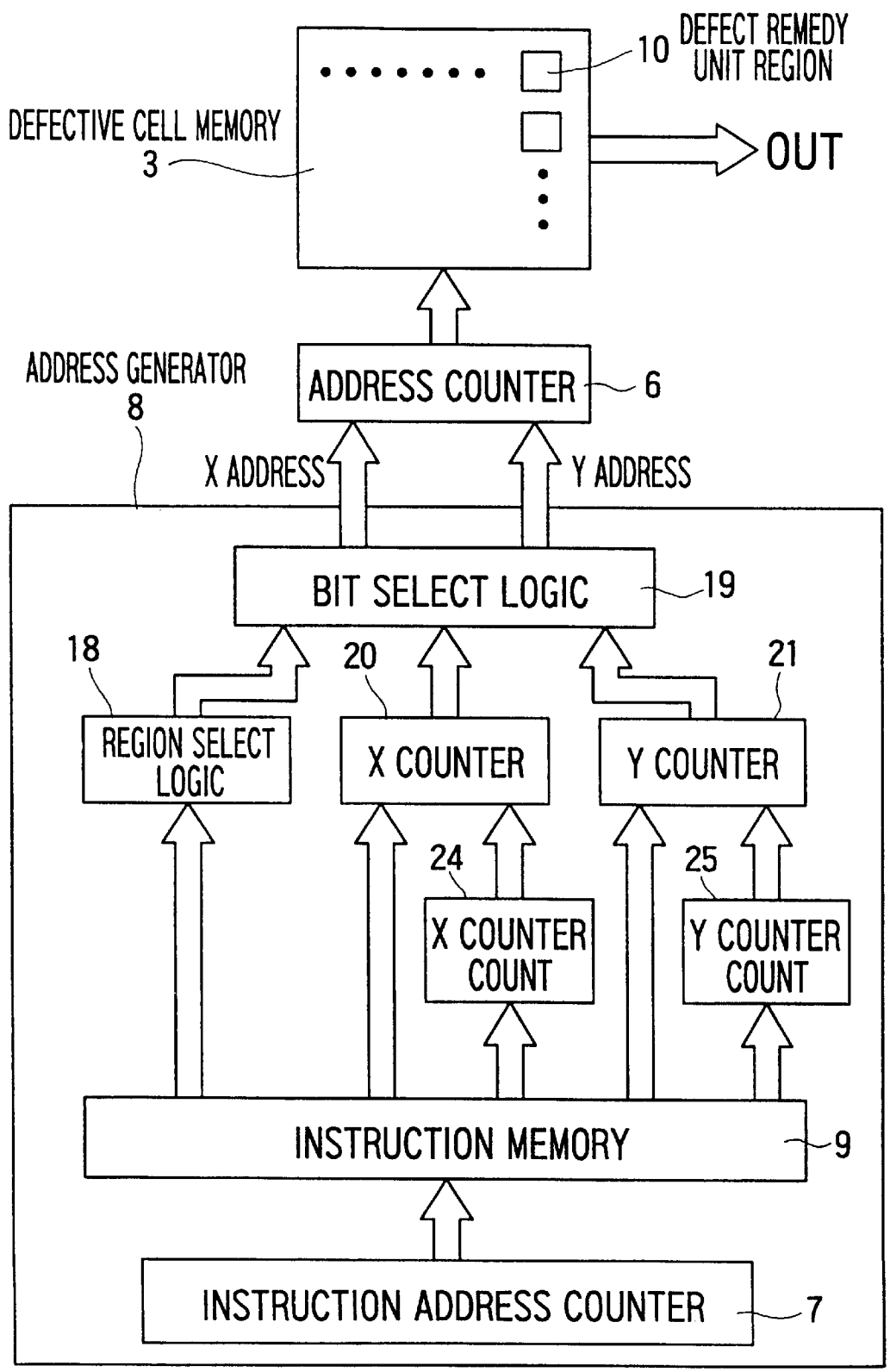
FIG. 1 is a block diagram showing a defect cell memory control section of the memory analyzing apparats according to the present invention.

FIG. 1 is a block diagram showing a defect cell memory control section of a memory analyzing apparatus according to the present invention. As shown in FIG. 1, a defect cell memory 3 stores the defects of a memory to be tested for each cell. The data stored in this defect cell memory 3 are transferred to the remedy analyzing apparatus (not shown in FIG. 1 but shown in FIG. 2) for analyzing whether the defective cells can be remedied or not by use of the remedy (spare) lines. Further, an address generator 8 is connected to the defect cell memory 3, to read data and further to transfer the read data to the remedy analyzing apparatus.

In order to collect the data read from the defect cell memory 3 in sequence in unit of the defect remedy region, in the address generator 8, an instruction memory 9 controlled by an instruction address counter 7 designates a region to a bit select logic 19 via a region select logic 18. Further, a selection sequence of the defect remedy unit regions 10 is previously programmed in the instruction memory 9.

On the other hand, the instruction memory 9 gives an address set of an X counter 20 and a Y counter 21, to an X counter control circuit 24 and a Y counter control circuit 25, respectively. Further, the instruction memory 9 outputs control signals related to the above-mentioned operation to the X and Y counter control circuits 24 and 25, respectively. As a result, the X counter 20 and the Y counter 21 execute a counting operation in such a way as to be suitable for selecting addresses of the memory elements in sequence for each the defect remedy unit region 10 selected by the region select logic 18, respectively. For instance, when the X counter 20 repeats such a counting operation that the address is incremented beginning from a certain address and then returned to the original address for each constant period, the Y counter 21 increments one address for each period of the X counter 20. As a result of the above-mentioned respective counts, it is possible to select any bit addresses in one defect remedy unit region 10 in sequence.

As the result of the above-mentioned operation, the address generator 8 gives an X address and a Y address to the address counter 6 for controlling the defect cell memory 3, so that the defect cell memory 3 can be accessed in unit of the defect remedy unit region 10.

Figure 2:
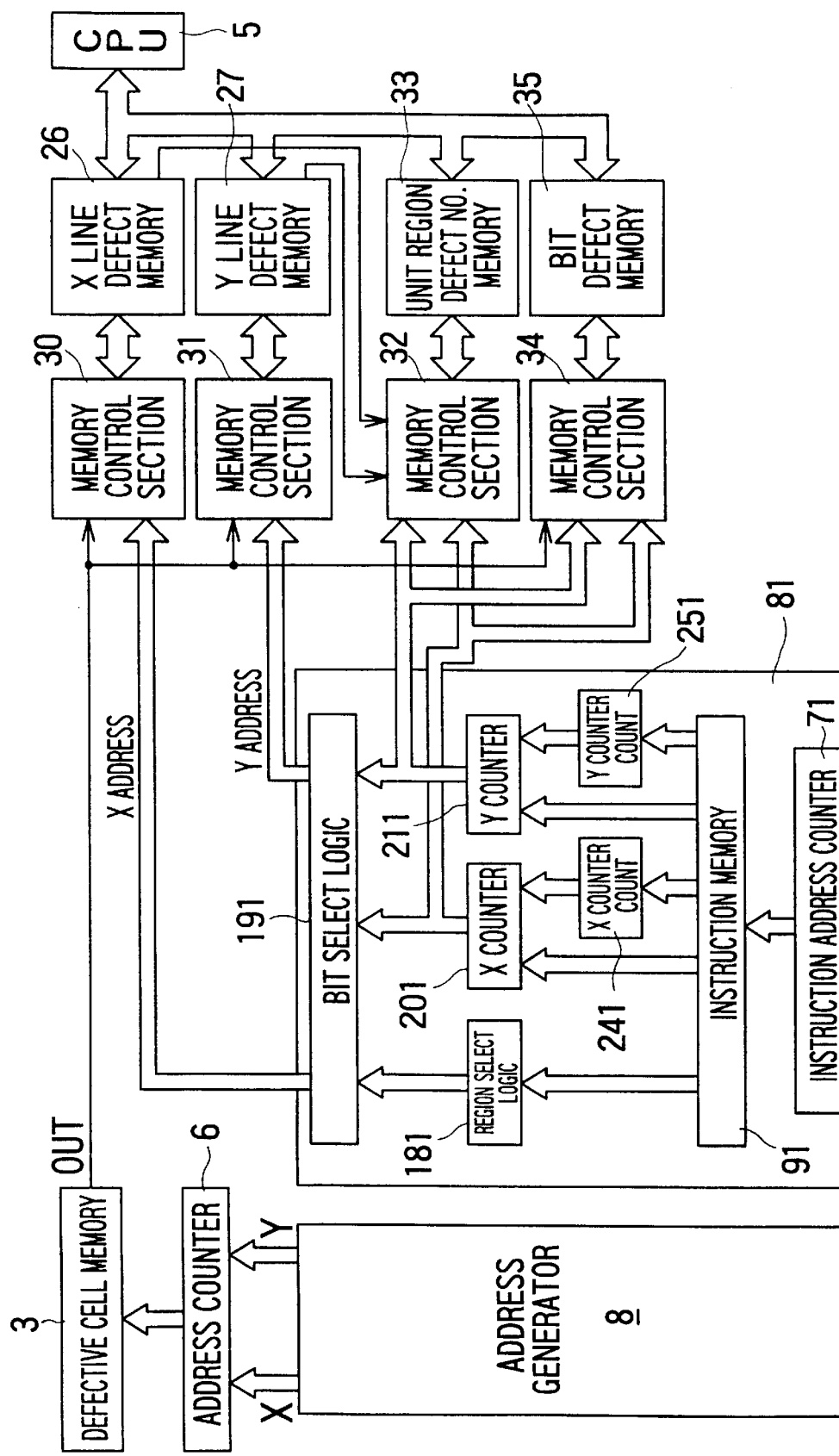
FIG. 2 is a block diagram showing a remedy analyzing apparatus of the remedy analyzing apparatus according to the present invention.

On the other hand, the remedy analyzing apparatus as shown in FIG. 2 processes the data transmitted from the defect cell memory 3 disposed on the memory tester body shown in FIG. 1. Further, FIG. 2 shows one circuit block for analyzing one output pin of one memory device, on the assumption that the data of the defect cell memory 3 are transferred independently for each output pin of the memory device and therefore the defects can be analyzed for each output pin.

As shown in FIG. 2, an address generator 81 is constructed in the same way as with the case of the address generator 8 shown in FIG. 1. That is, the data input can be controlled for each defect remedy unit region by an instruction memory 91 for generating an instruction on the basis of the count values obtained by an instruction address counter 71. The output of the instruction memory 91 are given to a bit select logic 191 via a region select logic 181, an X counter control circuit 241, a Y counter control circuit 251, an X counter 201, and a Y counter 211, in order to generate an X address and a Y address, respectively. Here, the X address is given to an X line defect memory 26 via a memory control section 30, and the Y address is given to a Y line defect memory 27 via a memory control section 31. Further, the X counter 201 and the Y counter 211 give the respective addresses to the bit select logic 191, and further to a unit region defect number memory 33 via a memory control section 32 and to a bit defect memory 35 via a memory control section 34, respectively. On the other hand, the data of the defect cell memory 3 are given to the memory control sections 30, 31 and 34, respectively to contribute to the data accumulation of an X line defect memory 26, a Y line defect memory 27, a bit defect memory 35, respectively. Further, the outputs of the line defect memory 26 and the bit defect memory 27 are given to the memory control section 32, to accumulate the number of the defects in a unit region defect number memory 33 for each defect remedy unit region. These X line defect memory 26, the Y line defect memory 27, the unit region defect number memory 33, and the bit defect memory 35 are all connected to a CPU 5 for executing the defect remedy analyzing processing. Here, in the case where defective data of a plurality of memories are transmitted from the defect cell memories 3, it is possible to construct the remedy analyzing apparatus by using a plurality of the CPUs 5, the X and Y line defect memories 26 and 27, the memory control sections 30, 31, 32 and 34, the unit region defect number memories 33, and the bit defect memories 35, respectively for simultaneous processing.

The operation of the remedy analyzing apparatus shown in FIG. 2 will be described hereinbelow.

The address generator 81 outputs address signals for controlling the memory control sections 30, 31, 32 and 34, respectively for each remedy unit region from which the defect cell memory 3 is selected. The outputted address signals are separately applied to the X line defect memory 26, the Y line defect memory 27, and the bit defect memory 35 appropriately. As a result, the X line defect memory 26 and the Y line defect memory 27 count and increment one line for each address, respectively. Further, the memory control section 34 loads an address whenever each remedy unit region is switched. When the line defect (a line having a number of defective bits more than a predetermined value) dose not exists, the memory control section 34 counts the bit defects. Further, the memory control section 32 counts the number of defects in the remedy unit region on the basis of the outputs of the X line defect memory 26 and the Y line defect memory 27.

As a result of the above-mentioned operation, the X line defects are stored in the X line defect memory 26 for each defect remedy unit region, and the Y line defects are stored in the Y line defect memory 27 for each defect remedy unit region. Further, the number of defects of each defect remedy unit region is stored in the unit region defect number memory 33, and the bit defects are recorded in the bit defect memory 35.

The defect data for each defect remedy unit region obtained as described above are transferred to the CPU 5 and analyzed for remedy.

Figure 3:
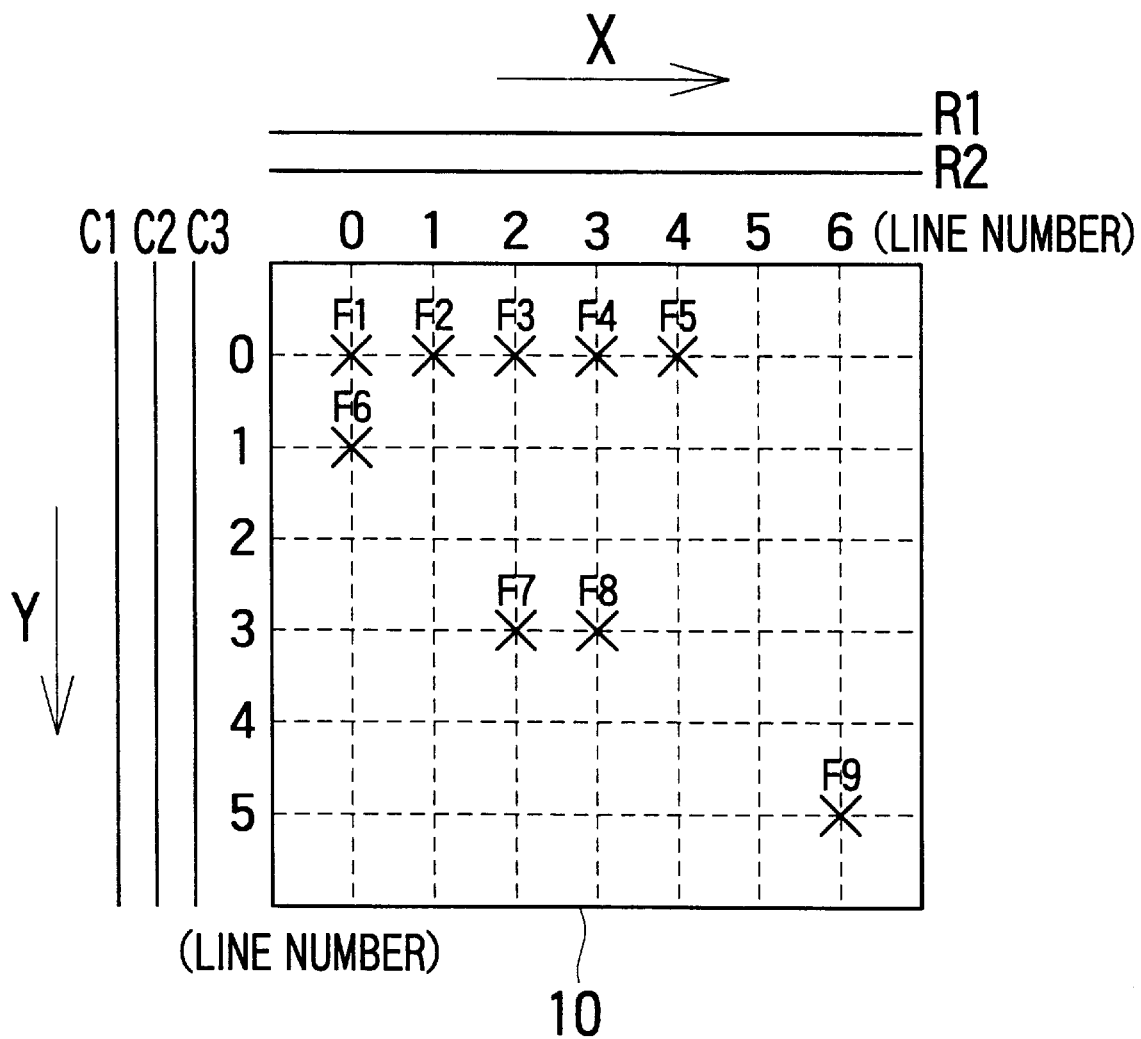
FIG. 3 is an illustration for assistance in explaining an example of defective bit distribution applied to the remedy analyzing apparatus according to the present invention.

Here, the assumption is made that the defect bits distribute in remedy unit region as shown in FIG. 3 and further there are three row remedy lines R1, R2 and R3 in the X direction and three column remedy lines C1, C2 and C3 in the Y direction.

Figure 4:
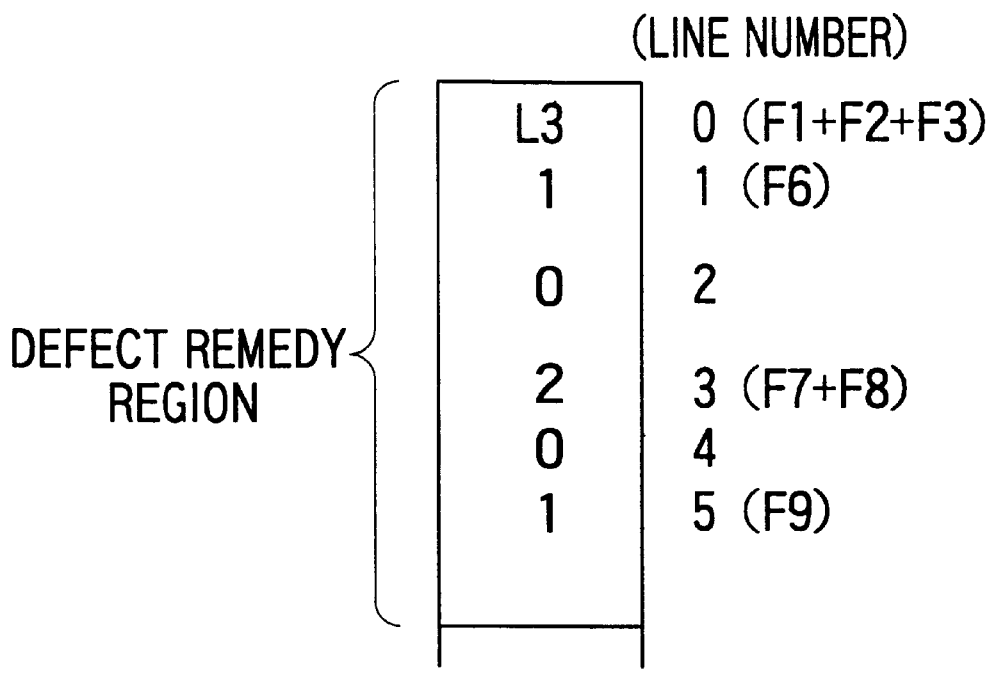
FIG. 4 is an illustration for assistance in explaining a status of an X-line defect memory corresponding to defective bits shown in FIG. 3.
Figure 5:
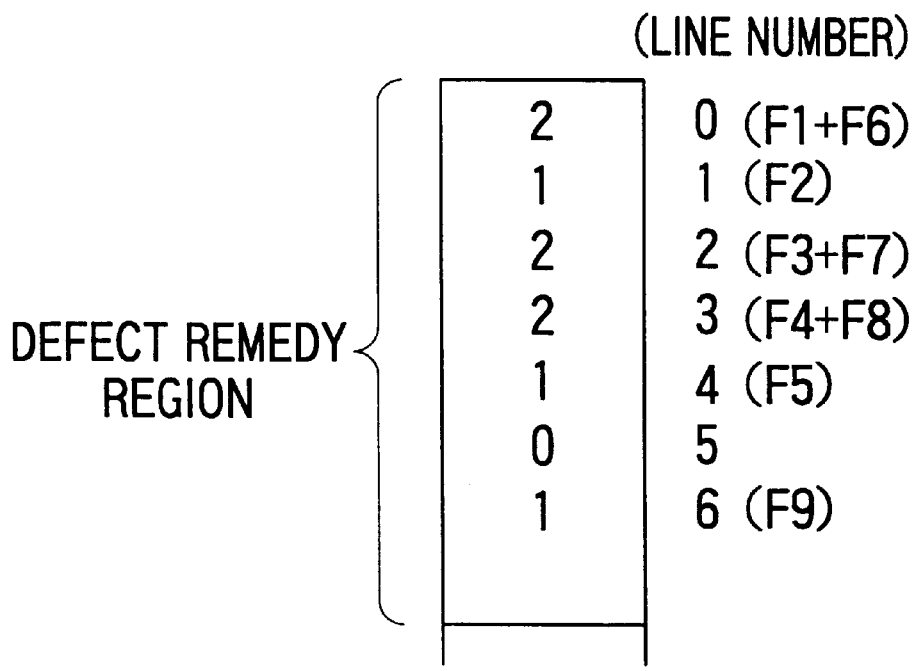
FIG. 5 is an illustration for assistance in explaining a status of a Y-line defect memory corresponding to defective bits shown in FIG. 3.

In this case, the count values of defective bits are stored in the X line defect memory 24 as shown in FIG. 4, and the count values of defect bits are stored in the Y line defect memory 27 as shown in FIG. 5. Here, the maximum number (the count value) of the row and column remedy (spare) lines is "3". Therefore, in the X line defect memory 26 shown in FIG. 4, a flag (line omission flag) L is raided to indicate that there are defect bits ("5" of F1 to F5) beyond the maximum number ("3").

Figure 6:
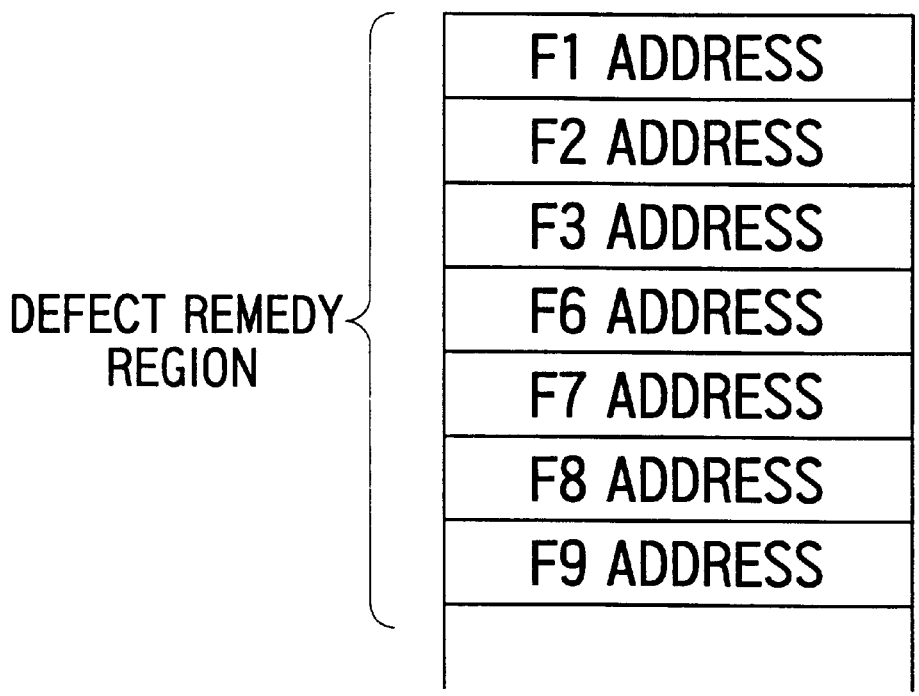
FIG. 6 is an illustration for assistance in explaining a status of a bit defect memory corresponding to the defective bits shown in FIG. 3.

On the other hand, in the bit defect memory 35, the defect bit addresses counted by the X line defect memory 26 and the Y line defect memory 27 are stored as shown in FIG. 6.

Figure 7:
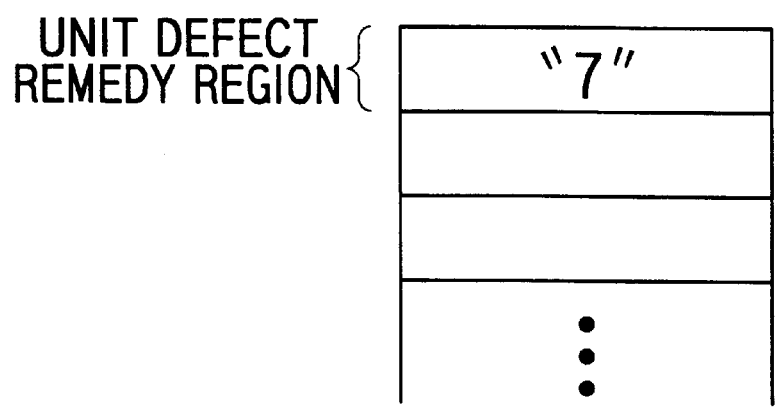
FIG. 7 is an illustration for assistance in explaining a status of a unit region defect number memory corresponding to the defective bits shown in FIG. 3.

Further, in the unit region defect number memory 33, the number of defect bits counted by the X line defect memory 26 and the Y line defect memory 27 are stored as shown in FIG. 7. In the case shown in FIG. 7, the total number of "7" of the defect bits F1, F2, F3, F5, F7, F8 and F9 is counted.

On the basis of the above-mentioned data stored in the X line defect memory 26 (shown in FIG. 4), the Y line defect memory 27 (shown in FIG. 5), the bit defect memory 35 (shown in FIG. 6), and the unit region defect number memory 33 (shown in FIG. 7), the CPU 5 allocates the remedy lines by executing the following analysis in accordance with software:

This analysis is executed by forming a defect bit table as shown in FIG. 8.

First, in the bit defect memory 35, a defect bit table is formed, except the cells each having a line omission flag L in the X line defect memory 26 and the Y line defect memory 27, which corresponds to the lower part of the table shown in FIG. 8. Here, the size of the defect bit table is decided on the basis of the value of the unit region defect number memory 33.

Successively, a remedy solution by use of a predetermined number of lines is obtained in both the row or column lines, respectively. The table shown in FIG. 8 is an example for checking where there exists a solution or not when two row remedy lines are used.

Now, before the above-mentioned processing, since the line including the defect bits F1, F2, F3, F4 and F5 is a line defect, one R1 of the two row remedy lines must be of course allocated thereto. Further, when the row remedy line R1 is allocated, it is possible to remedy the defect bits of F1, F2, F3, F4 and F5.

As a result, although the bits F6, F7, F8 and F9 remain as the non-remedy defect bits, it is checked whether these remaining defect bits can be remedied by use of a single remaining row remedy line and three column remedy lines or not.

In this case, it is possible to presume the possibility thereof on the basis of the number of the defect bits having different X addresses on the column side. In the case of the table shown in FIG. 8, the number of the different addresses is "4" in the X address direction. Here, when the defect bit F6 is remedied by one row remedy line R2, it can be understood that the remaining defect bits F7, F8 and F9 can be remedied by three column remedy lines C1, C2 and C3.

Further, the same processing as above is repeated by changing the number of the row remedy lines and the column remedy lines from one to the maximum number, to obtain an appropriate solution.

Now, even if each row remedy line and each column remedy lie can be set as described above, there exists the case where defective bits are included in the remedy (spare) line itself. The method of coping with this case will be described hereinbelow.

Figure 9:
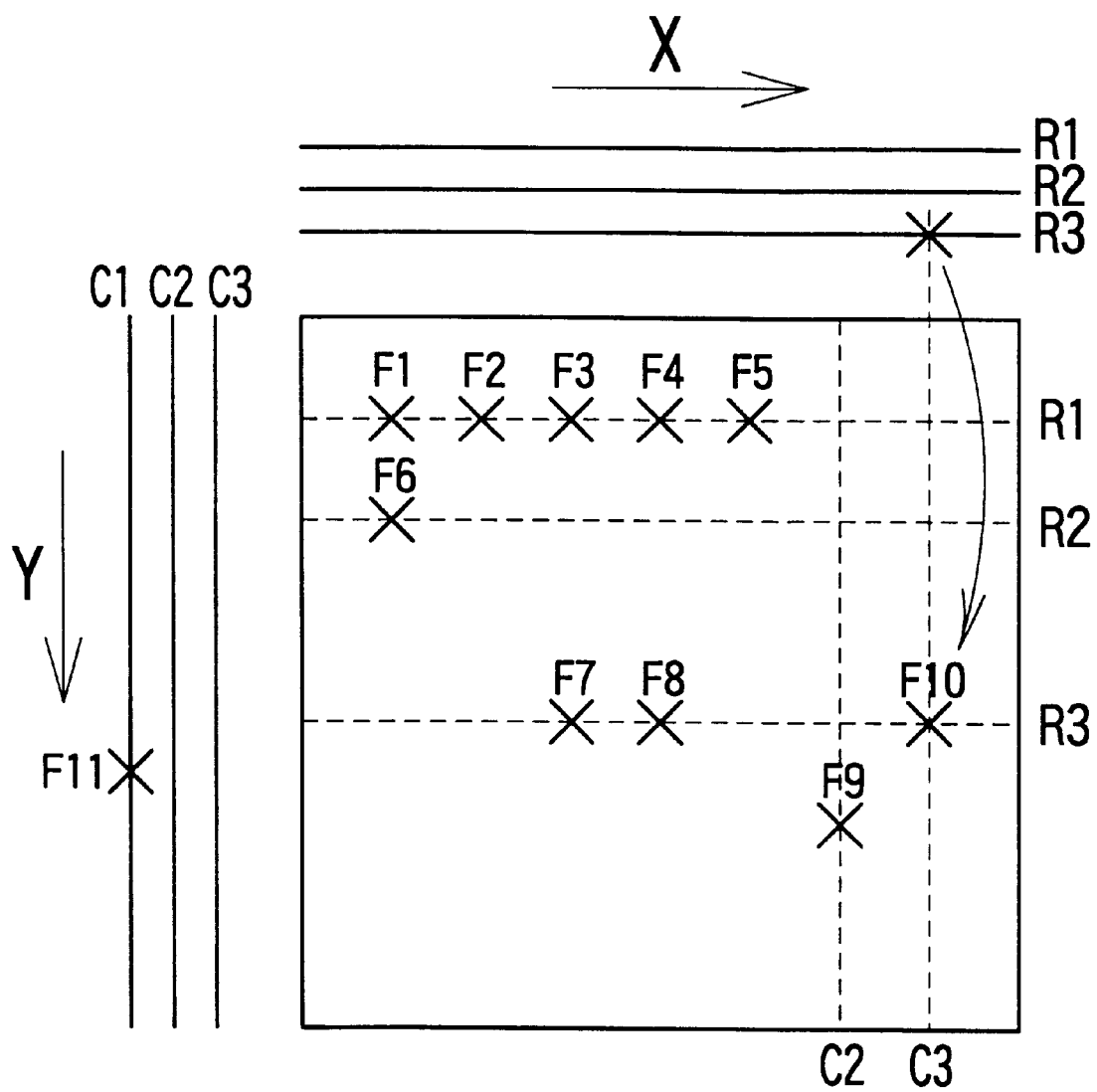
FIG. 9 is an illustration for assistance in explaining an example of a defective bit distribution and a remedy analysis, when a defective bit is newly added by a row remedy (spare) line.

Now, the assumption is made that a defect bit F10 is included in the row remedy line R3, and a defect bit Fil is included in the column remedy line C1. In this case, the defect bits in the defect remedy unit region can be mapped as shown in FIG. 9.

In this case, the defect bit table except the line defect can be shown as in FIG. 10. As understood with reference to FIG. 10, in this case, the row remedy line R2 is allocated to the defective bit F6, and the row remedy line R3 is allocated to the defective bits F7 and F8.

As a result, the a defective bit F10 develops in the row remedy line R3.

In this case, although the remaining defective bits are F9 and F10, it is possible to allocate the column remedy lines C1, C2 and C3 to these two defective bits F9 and F10. In this example shown in FIG. 10, the defective bit F9 is remedied by the column remedy line C2 and the defective bit F10 is remedied by the column remedy line C3.

Accordingly, when the remedy lines are allocated, it is necessary to analyze the combinations of the remedy line allocations by handing the row remedy lines R1 to R3 and the column remedy lines C1 to C3 as an independent line, respectively, without being limited only to the defect remedy unit region.

In the allocation of three row remedy lines R1 to R3, when there are three different addresses in the Y direction except the line defect, the number of combinations of how to allocate the row remedy lines R1 to R3 to the three addresses is "6". One of them is the allocation as shown in FIGS. 9 and 10. In this example, since the row remedy line R3 is used, although the defective bit F10 is newly added in the same line R3, since this defective bit F10 can be remedied by the column remedy line C3, it is possible to remedy all the defective bits.

Figure 11:
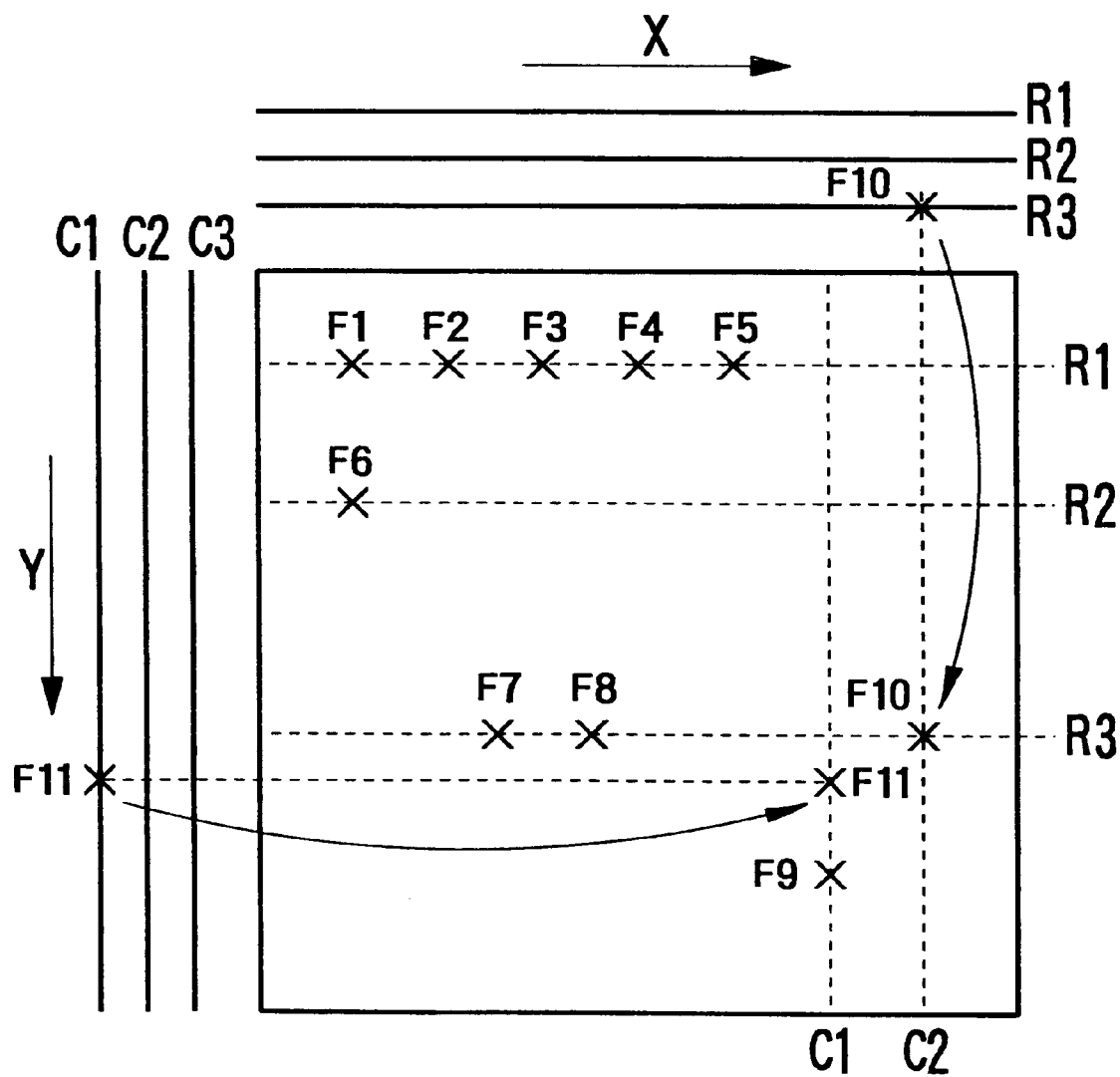
FIG. 11 is an illustration for assistance in explaining an example of a defective bit distribution and a remedy analysis, when a defective bit is newly added by a column remedy (spare) line.
Figure 12:
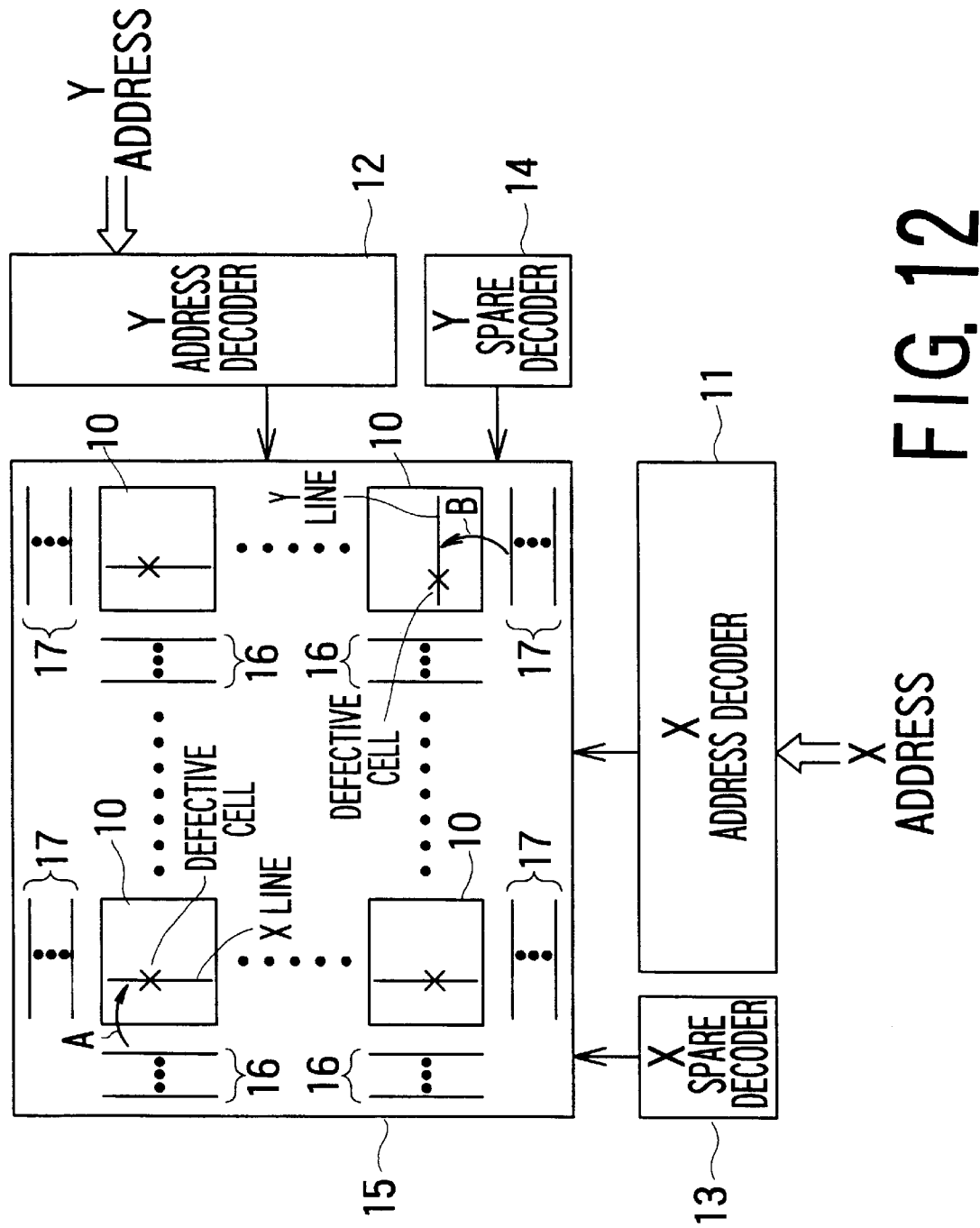
FIG. 12 is a block diagram showing a conventional memory construction.
Figure 13:
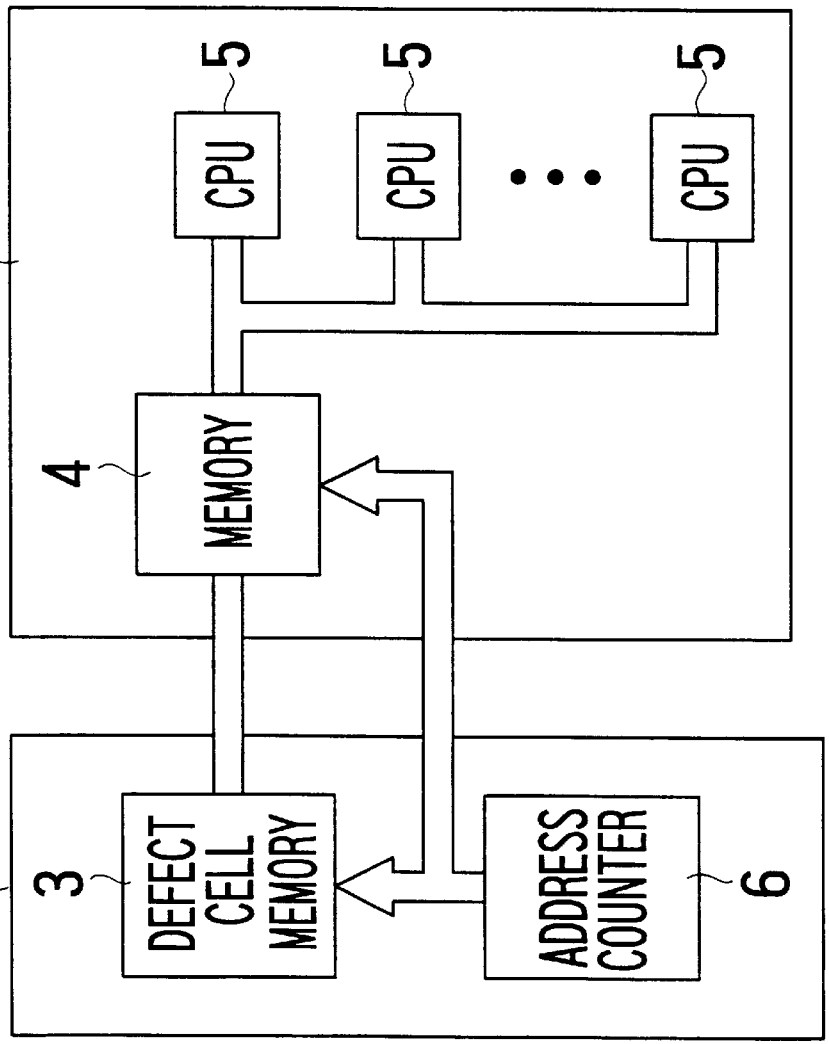
FIG. 13 is a block diagram showing a prior art memory analyzing apparatus.
Figure 14:
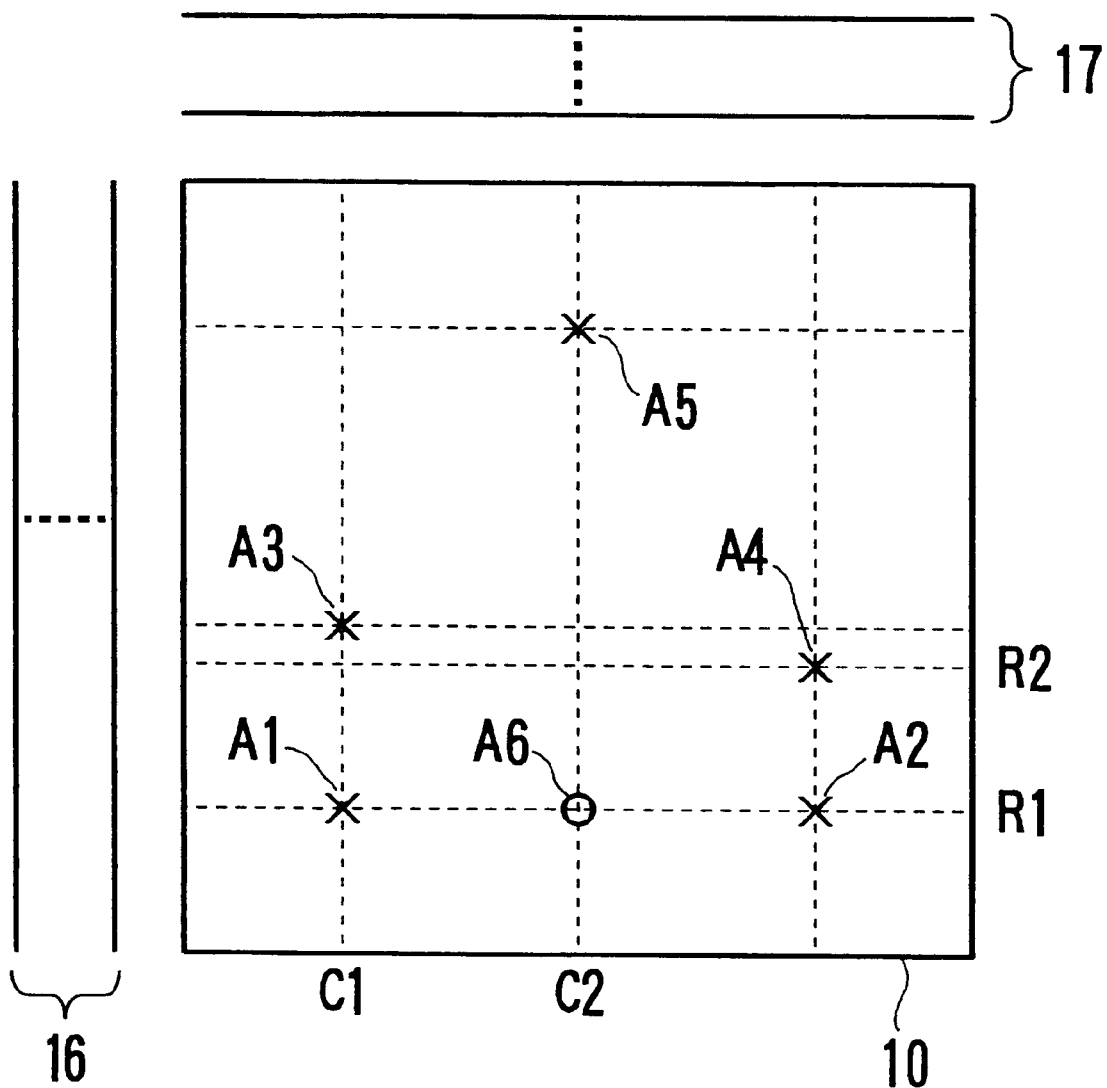
FIG. 14 is an illustration for assistance in explaining the conventional defect bit remedy.
Figure 15:
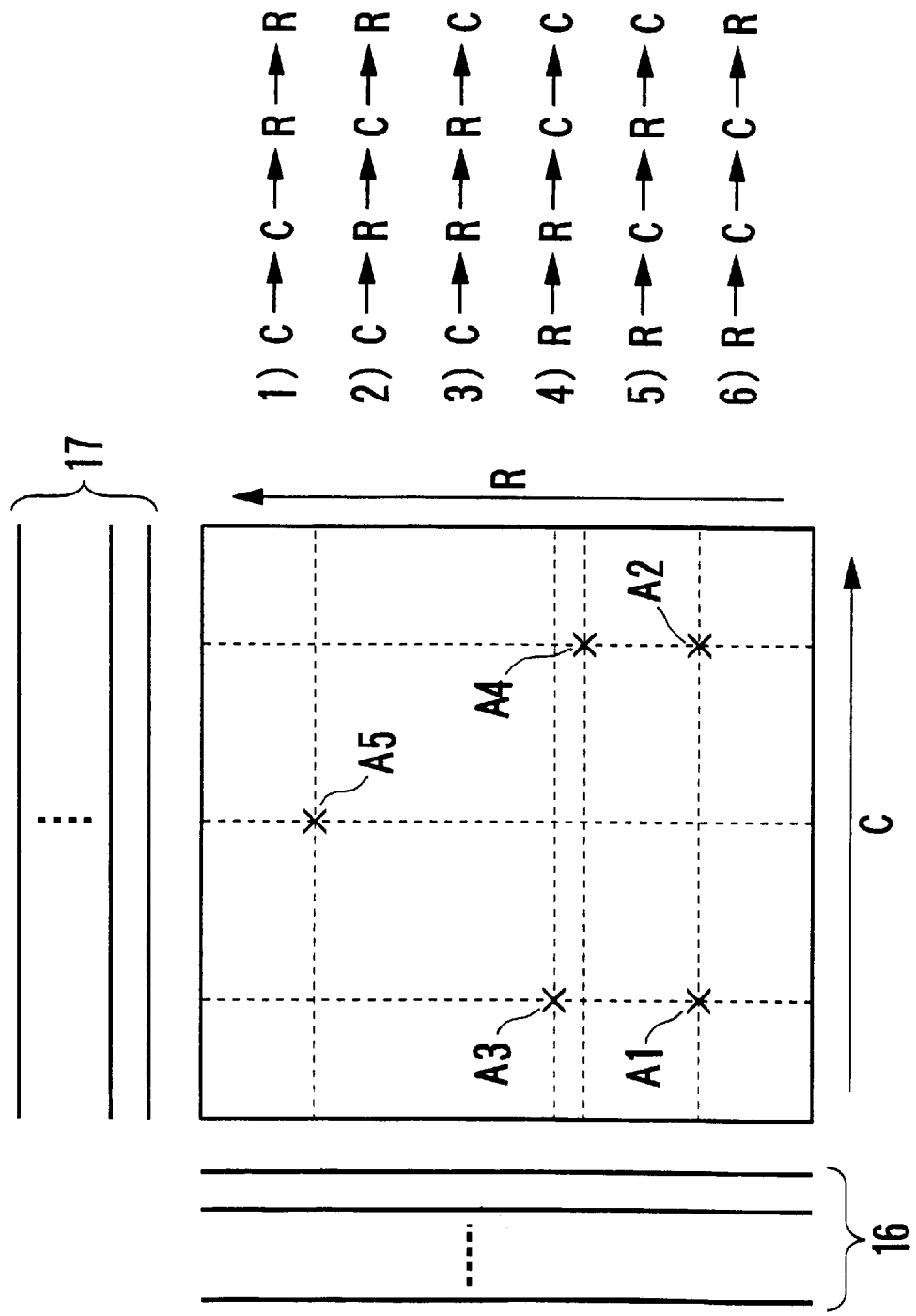
FIG. 15 is an illustration for assistance in explaining a procedure of the conventional defective bit remedy.
Figure 16:
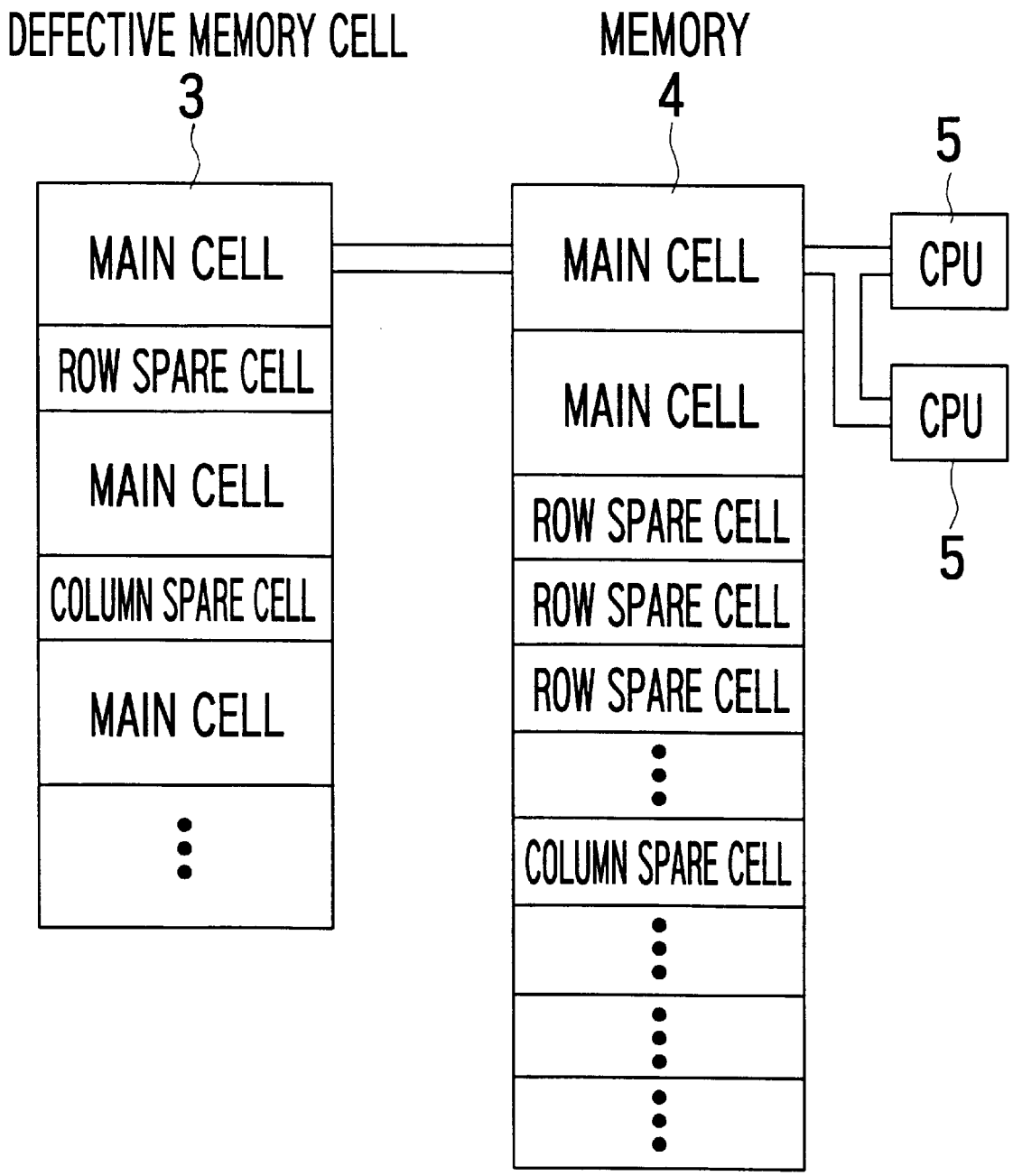
FIG. 16 is an illustration for assistance in explaining a defect cell memory and a memory status of the prior art memory analyzing apparatus shown in FIG. 13.
Figure 17:
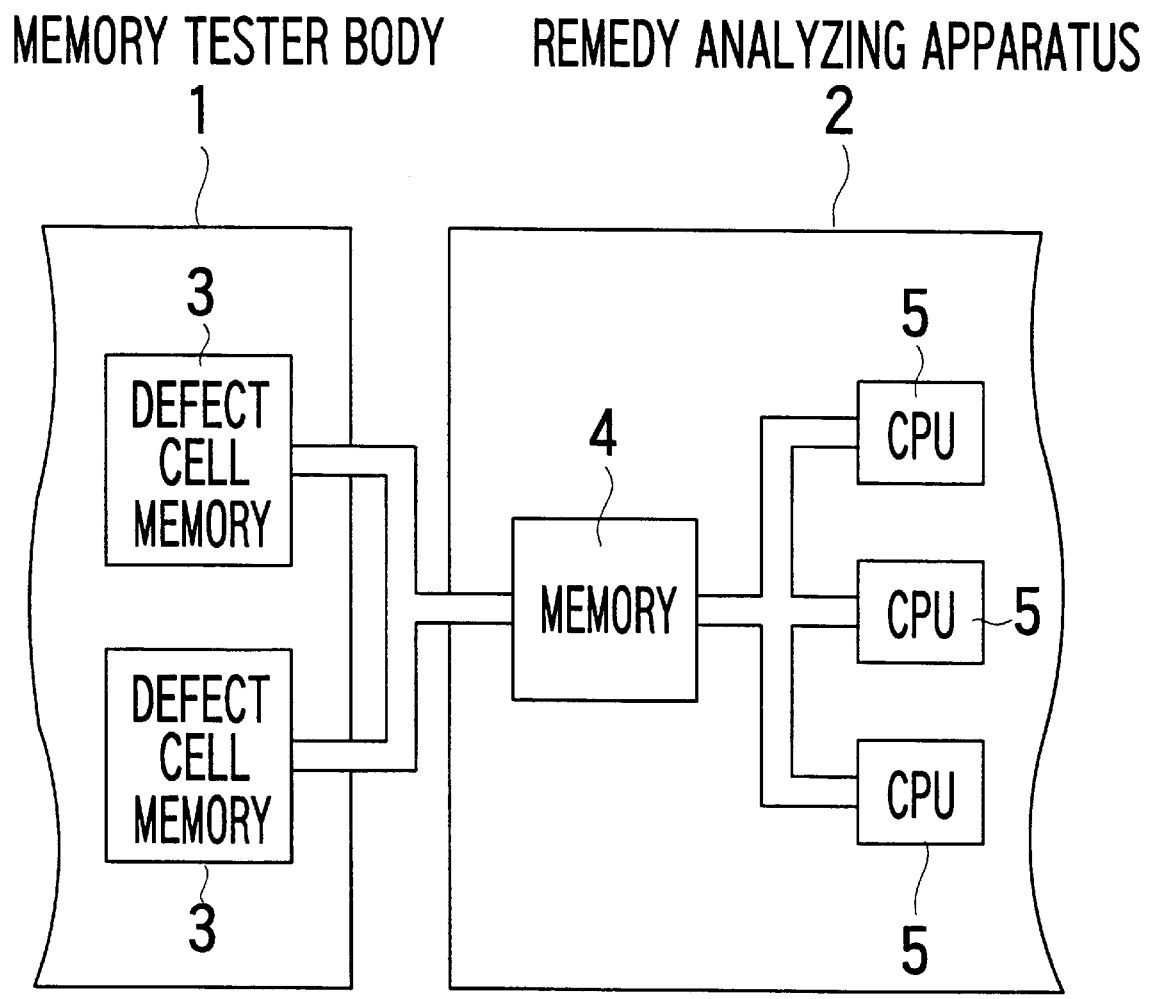
FIG. 17 is a block diagram showing an example of the defect cell memory, which can increase the speed of the defective bit remedy processing.

In contrast with this, as shown in FIG. 11, when the column remedy line C1 is used to remedy the defective bit F10, although a defective bit F11 of the column remedy line C1 is newly added, in this case, since the three row remedy lines R1 to R3 have been already all allocated to the other defective bits, it is impossible to remedy the defective bit F11.

In general, when the remedy solution is derived, first the number of the remedy lines used is decided in each of the row and column remedy lines. In this case, if it is unnecessary to use the remedy line including a defective bit, it is desirable not to use the remedy line including a defective bit. However, when the remedy line including a defective bit must be used from necessity, the remedy line is selected from the one having lesser defective bits. On the other hand, when there exists another remedy line in which defective bits are overlapped with the defective bits of the line to be remedied, this line is used with priority, to increase the remedy efficiency of the defective bits.

Further, the defective cells are collected in a table as shown in FIG. 10, and the combinations are formed for each different X line or Y line. Further, the defective bits remedied by the use of the maximum number of the remedy lines and the defective bits newly added by the remedy line are written in the table in sequence.

Further, since the defective bits newly added by the remedy lines are to be remedied by use of the remedy lines arranged in the opposing direction, it is necessary to always to check the number of the remedy lines.

When the number of the remedy lines is sufficiently large and thereby it is possible to remedy the defective bits without use of the remedy line including defective bits, a remedy solution can be obtained simply.

On the other hand, when the remedy line including a defective bit is used, the defective bits newly added are listed in the table, and it is discriminated whether the defective bits can be remedied or not by checking whether there exists an surplus remedy line or not; that is, by checking whether the newly added defective bits can be remedied or not.

In the above-mentioned construction, in the memory analyzing apparatus according to the present invention, the number of the defective bits in both the X and Y directions are counted and stored in both the X line defect memory 26 and the Y line defect memory 27, respectively for each defective bit distribution in each defect remedy unit region 2; the addresses of the defective bits counted in the X line defect memory 26 and the Y line defect memory 27 are stored in the bit defect memory 35; and the number of the defective bits are stored in the unit region defect number memory 33. Further, on the basis of these stored data, the CPU 5 forms a defective bit table, and analyzes the combinations of the row remedy lines and the column remedy lines each used to remedy the defective bits, in such a way as to find an optimum solution. Further, the line defect (having a number of defective bits more than a predetermined value) is remedied with a priority. Further, the remedy solution of the remaining defective bits is obtained for each line combination of the remedy lines each allocated to remedy at least one defective bit. Further, when defective bits included in the remedy lines are newly added, a defective bit table is additionally formed, and the remedy solution including the newly added defective is obtained to reach a final defect remedy solution.

In this case, in the prior art method, since all the combinations of the row remedy line allocation and the column remedy line allocations are checked in sequence, the number of the combinations is very large. In contrast with this, in the present invention, since the lines to be allocated with a priority can be decided on the basis of the number of counts of the X line defect memory 26 and the Y line defect memory 27 and the line defect flag status, it is possible to necessarily reduce the number of combinations to be checked. As a result, the number of tries and errors can be reduced largely, so that it is possible to reduce the processing time markedly.

Further, in the above-mentioned embodiment, although the line defect is decided when the number of the defective bits is more than "3", the number of the defective bits can be of course appropriately determined according to the number of remedy lines.

Further, in the above-mentioned embodiment, although the memory analyzing apparatus is of address generator, it is possible to use any construction, as far as defective data can be obtained from the defect cell memory 3 in unit of defect remedy unit region 10.

Further, in the above-mentioned embodiment, although the addresses of the X line defect memory 26, the Y line defect memory 27, the unit region defect number memory 33, and the bit defect number memory 25 are all selected by use of the common address generator 11, when the addresses must be set to any desired values, separately to select the defect remedy unit region 10, it is possible to arrange two different X and Y line counters for the defect remedy unit region 10 so as to be controllable separately. In this case, it is possible to detect the line defects in a small capacity memory (not a $2^N$ capacity memory).

Further, when the defect analysis is executed by using data related to the defect data of the remedy lines in addition to the main cell section, although it is necessary to separate the X line defect memory 26, the Y line defect memory 27, the bit defect memory 35, and the unit region defect number memory 33, for each of the main cell section, the row remedy section, and the column remedy section, respectively. However, when the conditions of the bit select logic 191 of the address generator 81 can be obtained separately on the basis of the X and Y data, it is possible to manage the data together. Further, when the bit select logic 191 is modified so as to manage the line defect decision and the flags indicative of the line defect, it is possible to use any desired decision values independently.

Further, in the present embodiment, when the program used for the CPU 5 is modified, various modifications of the present invention can be made. Further, at present, although the remedy lines are mainly used to remedy line defects and bit defects, it is possible to apply the gist of the present invention to various new remedy systems such as the remedy of bit unit, the remedy of group unit, or a combination of both.

As described above, in the memory analyzing apparatus according to the present invention, since the data of the defect cell memory for storing defect data of the memory device to be checked are transferred together to the remedy analyzing apparatus for each defect remedy unit region, since the remedy analyzing apparatus stores the transferred data for each X line defect, Y line defect, defect bit address, defect bit number in each defect remedy unit region, to form a table on the basis of these memory contents, and since the defect bit remedy is analyzed on the basis of the contents of the formed table, it is possible to obtain various effects such as simplification of the data processing method, reduction of the load of the CPU, effective defective bit remedy, application to a large capacity memory, etc.

What is claimed is:

1. A memory analyzing apparatus, comprising:
    a defect cell memory for storing data related to defective bits of a memory to be measured;
    an X line defect memory for counting the number of defective bits in X line direction for each X line on the basis of data related to the defective bits transferred from said defect cell memory, to label an X line including defective bits more than a previously determined number as a defective line;
    a Y line defect memory for counting the number of defective bits in Y line direction for each Y line on the basis of data related to the defective bits transferred from said defect cell memory, to label a Y line including defective bits more than a previously determined number as a defective line;
    a bit detect memory for storing addresses of the defective bits counted by said X line defect memory and said Y line defect memory, respectively;
    a defect number memory for storing the numbers of defective bits calculated on the basis of values counted by said X line defect memory and said Y line defect memory, respectively, and
    a processor for executing remedy processing of defective cells on the basis of data stored in said X line defect memory, said Y line defect memory, said bit defect memory, and said defect number memory, respectively.

2. The memory analyzing apparatus of claim 1, wherein said processor first remedies a single or a plurality of lines labeled as a defective line or defective lines in the X line and Y line, respectively by replacing the defective line or defective lines with remedy line or remedy lines arranged in the X direction and Y direction, respectively with a priority over a non-defective line or non-defective lines not labeled, and then executes remedy of the non-defective line or non-defective lines each having a single or a plurality of defective bits in both the X line and Y line, respectively.

3. The memory analyzing apparatus of claim 2, wherein said processor forms a table for remedying defective bits, and executes remedy analysis in accordance with the formed table in sequence, an X address and a Y address of each defective bit and available remedy lines in both the X direction and Y direction being listed in the table.

4. The memory analyzing apparatus of claim 3, wherein said processor obtains an optimum remedy solution by executing the remedy analysis in sequence by changing the numbers of the X direction remedy line and the Y direction remedy line, respectively beginning from a single line to the maximum line number.

5. The memory analyzing apparatus of claim 3, wherein said processor adopts the remedy line not including a defective bit, with priority.

6. The memory analyzing apparatus of claim 3, wherein said processor adopts the remedy line including a smaller number of defective bits, with priority, when the remedy lines are used for remedy in both the X direction and Y direction, respectively.

7. The memory analyzing apparatus of claim 3, wherein when the lines are remedied by replacement with the remedy lines in both the X direction and Y direction, if the replaced remedy line has some defective bits, the newly produced defective bits are written in the table in sequence and then the remedy analysis is executed in accordance with the table in which the new defective bits are additionally written.

8. The memory analyzing apparatus of claim 2, wherein said processor adopts the remedy line not including a defective bit with priority.

9. The memory analyzing apparatus of claim 2, wherein said processor adopts the remedy line including a smaller number of defective bits, with priority, when the remedy lines are used for remedy in both the X direction and Y direction, respectively.

10. The memory analyzing apparatus of claim 2, wherein the previously determined number used when said X line defect memory labels the line as a defective line is decided according to the number of the remedy lines prepared in the X direction, and the previously determined number used when said Y line defect memory labels the line as a defective line is decided according to the number of the remedy lines prepared in the Y direction.

11. The memory analyzing apparatus of claim 2, wherein the labeling of the defective line is executed by raising a line omission flag.

12. A memory analyzing apparatus, comprising:
    a defect cell memory for storing data related to defective bits of a memory to be measured, a memory region of said defect cell memory being divided into a plurality of defect remedy unit region memory sections in correspondence to each of defect remedy unit regions of the memory to be measured;
    an X line defect memory for counting the number of defective bits in X line direction for each X line on the basis of data related to the defective bits transferred from said defect cell memory, to label an X line including defective bits more than a previously determined number as a defective line;
    a Y line defect memory for counting the number of defective bits in Y line direction for each Y line on the basis of data related to the defective bits transferred from said defect cell memory, to label a Y line including defective bits more than a previously determined number as a defective line;
    a bit detect memory for storing addresses of the defective bits counted by said X line defect memory and said Y line defect memory, respectively;
    a defect number memory for storing the numbers of defective bits calculated on the basis of values counted by said X line defect memory and said Y line defect memory, respectively, said defect number memory being a unit region defect number memory for storing the number of defective bits for each of the defect remedy unit regions;

memory control section for transferring the data read for each of the defect remedy unit region memory sections to said X line defect memory, said Y line defect memory, said bit defect memory and said defect number memory, respectively; and a processor for executing remedy processing of defective cells on the basis of data stored in said X line defect memory, said Y line defect memory, said bit defect memory, and said defect number memory, respectively.

13. The memory analyzing apparatus of claim 12, wherein said processor first remedies a single or a plurality of lines labeled as a defective line or defective lines in the X line and Y line, respectively by replacing the defective line or defective lines with remedy line or remedy lines arranged in the X direction and Y direction, respectively with a priority over a non-defective line or non-defective lines not labeled, and then executes remedy of the non-defective line or non-defective lines each having a single or a plurality of defective bits in both the X line and Y line, respectively.

14. The memory analyzing apparatus of claim 13, which further comprises:

a first address generator for applying an address to said defective cell memory to head out data therefrom and to output the data to outside, said read out operation being is performed according to a predetermined address order for each said defect remedy unit region, and a second address generator, which operates in synchronization with said first address generator, for outputting and applying address signals to said X line defect memory, said Y line defect memory, said bit defect memory and said defect number memory, respectively, for each said region selected by the address outputted from said first address generator.

15. The memory analyzing apparatus of claim 13, wherein said processor forms a table for remedying defective bits, and executes remedy analysis in accordance with the formed table in sequence, an X address and a Y address of each defective bit and available remedy lines in both the X direction and Y direction being listed in the table.

16. The memory analyzing apparatus of claim 15, wherein when the lines are remedied by replacement with the remedy lines in both the X direction and Y direction, if the replaced remedy line has some defective bits, the newly produced defective bits are written in the table in sequence and then the remedy analysis is executed in accordance with the table in which the new defective bits are additionally written.

17. The memory analyzing apparatus of claim 12, wherein said processor adopts the remedy line not including a defective bit with priority.

18. The memory analyzing apparatus of claim 12, wherein said processor adopts the remedy line including a smaller number of defective bits, with priority, when the remedy lines are used for remedy in both the X direction and Y direction, respectively.

19. The memory analyzing apparatus of claim 12, wherein the previously determined number used when said X line defect memory labels the line as a defective line is decided according to the number of the remedy lines prepared in the X direction, and the previously determined number used when said Y line defect memory labels the line as a defective line is decided according to the number of the remedy lines prepared in the Y direction.

20. The memory analyzing apparatus of claim 12, wherein the labeling of the defective line is executed by raising a line omission flag.

21. A memory analyzing method which comprises:

dividing a memory region of a memory to be measured into a plurality of defect remedy unit regions;

counting the number of defective bits in X line direction for each X line and in Y line direction for each Y line, respectively;

labeling each X/Y line including defective bits more than a previously determined number as a defective line;

remedying firstly a single or a plurality of lines labeled as defective line or defective lines in the X line and Y line, then remedying the other lines each having a single or a plurality of defective bits in the X line and Y line, respectively.

* * * * *